(12) United States Patent
Hong

(10) Patent No.: US 11,223,353 B1
(45) Date of Patent: Jan. 11, 2022

(54) ELECTRONIC SWITCH AND METHOD FOR OPERATION THEREOF

(71) Applicant: Soon-Gu Hong, Chungcheongbuk-do (KR)

(72) Inventor: Soon-Gu Hong, Chungcheongbuk-do (KR)

(*) Notice: Subject to any disclaimer, the term of this patent is extended or adjusted under 35 U.S.C. 154(b) by 0 days.

(21) Appl. No.: 17/070,794

(22) Filed: Oct. 14, 2020

(51) Int. Cl.
| | |
|---|---|
| H04B 3/54 | (2006.01) |
| H02H 3/00 | (2006.01) |
| H02H 3/08 | (2006.01) |
| H03K 17/687 | (2006.01) |
| H03K 17/785 | (2006.01) |
| H02H 1/06 | (2006.01) |

(52) U.S. Cl.
CPC ............ H03K 17/687 (2013.01); H02H 1/06 (2013.01); H03K 17/785 (2013.01)

(58) Field of Classification Search
None
See application file for complete search history.

(56) References Cited

U.S. PATENT DOCUMENTS

| | | | | |
|---|---|---|---|---|
| 8,450,950 B2* | 5/2013 | McRae | ................. | H05B 45/20 |
| | | | | 315/318 |
| 9,681,523 B2* | 6/2017 | Wang | ................. | H05B 47/155 |
| 10,874,006 B1* | 12/2020 | Davis | ..................... | H05B 45/48 |
| 10,998,935 B2* | 5/2021 | Liu | ......................... | H04L 12/40 |

FOREIGN PATENT DOCUMENTS

KR   10-2009-0094769   9/2009

* cited by examiner

*Primary Examiner* — Kenneth B Wells
(74) *Attorney, Agent, or Firm* — Intellectual Property Law Group LLP

(57) ABSTRACT

The present invention provides an electronic switch including: a connection unit including connection terminals to which at least two or more loads requiring supply of power are respectively connected; a power connection unit including power terminals configured to receive a power from an outside; a radio signal reception unit which includes at least two or more operation buttons for controlling supply of power to each load connected to the connection unit, and is wirelessly connected to a remote controller, which sends radio signals having different identifiers according to an operation of each of the operation buttons, to receive a radio signal; a switching circuit unit which is configured to receive a power from the power terminal of the power connection unit, includes switching circuits connected to each of the connection terminals, and is configured to supply the power to the loads connected to the connection terminals or cut off supply of power according to a turn-on or turn-off operation of the switching circuit based on a switching control signal; and a central control unit configured to, when receiving the radio signal, generate a switching control signal to be transmitted to each of the switching circuits using an identifier in the received radio signal.

8 Claims, 4 Drawing Sheets

ELECTRONIC SWITCH AND METHOD FOR OPERATION THEREOF

BACKGROUND OF THE INVENTION

1. Field of the Invention

The present invention relates to an electronic switch for controlling a power supplied to a device by controlling an AC current for a household, and a method for operation thereof.

2. Description of the Related Art

In general, operations of various devices may be performed by a control of a power supplied to the devices. That is, it is necessary to supply a power to the device for operating the same, and cut off the power supplied to the device for stopping the operation.

Such a control of the supply of power is performed using a programmable logic controller (PLC).

The PLC system includes a distribution board which receives high-voltage electricity from a power company, converts the received electricity into a low-voltage power that can be used in the facility, and distributes the converted power to a cabinet panel located at each position through trunk lines; the cabinet panel for distributing the power received from the distribution board to outlets, lightings, machines, and the like, which are installed at a floor or a ceiling of each home or building; and a control panel for controlling operations of the machines and devices that use the power by controlling the power required to operate the same.

In a typical PLC, a switch is configured to control the supply of power using a relay, and controls the power supplied to the device by performing switching operation thereof through a control of the relay.

However, since the switch using the relay has a limitation in mechanical operation, when a high-speed operation is required, there is a problem that it is not suitable in application.

In addition, there is a problem that a spark is generated in the switch using the relay at the moment when the contacts come into contact, and thereby noise is generated.

PRIOR ART DOCUMENT

Patent Document
Korean Patent Publication No. 10-2009-0094769 (published on Sep. 8, 2009)

SUMMARY OF THE INVENTION

It is an object of the present invention to provide an electronic switch capable of controlling supply of power by generating a control signal when receiving a radio signal from a remote controller and transmitting the signal to a switching circuit, and a method for controlling an operation thereof.

In addition, another object of the present invention is to provide an electronic switch capable of minimizing a generation of noise as well as being suitably used for high-speed operation by configuring a switching circuit with a photo TRIAC coupler and a TRIAC, and a method for controlling an operation thereof.

The problems to be solved by the present invention are not limited to the above-described objects, and other problems to be solved that are not mentioned above may be clearly understood by persons having common knowledge in the technical field to which the present invention pertains from the following descriptions.

To achieve the above-described objects, according to an aspect of the present invention, there is provided an electronic switch including: a connection unit including connection terminals to which at least two or more loads requiring supply of power are respectively connected; a power connection unit including power terminals configured to receive a power from an outside; a radio signal reception unit which includes at least two or more operation buttons for controlling supply of power to each load connected to the connection unit, and is wirelessly connected to a remote controller, which sends radio signals having different identifiers according to an operation of each of the operation buttons, to receive a radio signal; a switching circuit unit which is configured to receive a power from the power terminal of the power connection unit, includes switching circuits connected to each of the connection terminals, and is configured to supply the power to the loads connected to the connection terminals or cut off supply of power according to a turn-on or turn-off operation of the switching circuit based on a switching control signal; and a central control unit configured to, when receiving the radio signal, generate a switching control signal to be transmitted to each of the switching circuits using an identifier in the received radio signal.

According to embodiments of the present invention, the remote controller may send a radio signal having a frequency band of 322 MHz or less or a frequency band of 424 MHz to 447 MHz.

According to embodiments of the present invention, the central control unit may be configured to, when receiving a radio signal for controlling any one of the loads connected to the connection unit, generate a switching control signal for turning on a switching circuit connected to any one of the loads, and then match a deletion time with the identifier in the received radio signal and store the same in a memory, and when again receiving a radio signal having an identifier stored in the memory within a deletion time, generate a switching control signal for turning off the switching circuit connected to any one of the loads and delete the identifier stored in the memory.

According to embodiments of the present invention, the central control unit may be configured to, when receiving a radio signal for controlling all loads connected to the connection unit within the deletion time, supply a power to the loads or cut off the supply of power, and delete the identifier stored in the memory.

According to embodiments of the present invention, the connection unit may include first and second connection terminals, and when first and second loads are connected to the first and second connection terminals, the remote controller unit, which includes first and second operation buttons for controlling supply of power to the first and second loads and at least one or more button for controlling supply of power to both of the first load and the second load, may send radio signals having different identifiers from each other for each of the operation buttons, the switching circuit unit may include first and second switching circuits connected to the first and second connection terminals, respectively, and when receiving the radio signal, the central control unit may generate a switching control signal for controlling one or both of the first and second switching circuits using the identifier in the received radio signal.

According to embodiments of the present invention, each of the switching circuits may include: a photo TRIAC coupler configured to be turned on or off by receiving the switching control signal; and a TRIAC configured to, when the photo TRIAC coupler is turned on, connect the connection terminal and the power terminal so that the power is supplied to the load connected to the connection terminal, and when the photo TRIAC coupler is turned off, brake the connection between the connection terminal and the power terminal so that supply of power to the load connected to the connection terminal is stopped.

According to another aspect of the present invention, there is provided a method for controlling an electronic switch including: a connection unit including connection terminals to which at least two or more loads requiring supply of power are respectively connected; a power connection unit including power terminals configured to receive a power from an outside; a radio signal reception unit configured to receive a radio signal from an outside; and a switching circuit unit which is configured to receive a power from the power terminal of the power connection unit, includes switching circuits connected to each of the connection terminals, and is configured to supply the power to the loads connected to the connection terminals or cut off supply of power according to a turn-on or turn-off operation of the switching circuit based on a switching control signal, the method including: receiving, by the radio signal reception unit, a radio signal having an identifier for controlling any one of loads connected to the connection unit from a remote controller which includes two or more operation buttons for controlling supply of power to each load connected to the connection unit; generating, by a central control unit, a switching control signal for turning on a switching circuit connected to any one of the loads; matching, by the central control unit, a deletion time with the received identifier and storing the same in a memory; and when again receiving a radio signal having an identifier stored in the memory within a deletion time, generating, by the central control unit, a switching control signal for turning off a switching circuit connected to any one of the loads, and deleting the identifier stored in the memory.

According to embodiments of the present invention, the method may further include: when receiving a radio signal having an identifier for controlling all of the loads connected to the connection unit within the deletion time, generating, by the central control unit, a switching control signal for turning on or off each of the switching circuits to supply a power to the loads or cut off the supply of power, and deleting the identifier stored in the memory.

According to embodiments of the present invention, in the step of receiving the radio signal, a radio signal having a frequency band of 322 MHz or less or a frequency band of 424 MHz to 447 MHz may be received from the remote controller.

According to the above-described means for achieving the objects of the present invention, it is possible to provide an electronic switch capable of wirelessly controlling, which can control the supply of power by generating a control signal when receiving a radio signal from the remote controller and transmitting the signal to the switching circuit, and thereby improving the convenience of a user.

Further, according to the above-described means for achieving the objects of the present invention, by configuring the switching circuit with the photo TRIAC coupler and the TRIAC, a generation of noise may be minimized, as well as the electronic switch may be suitably used for high-speed operation.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
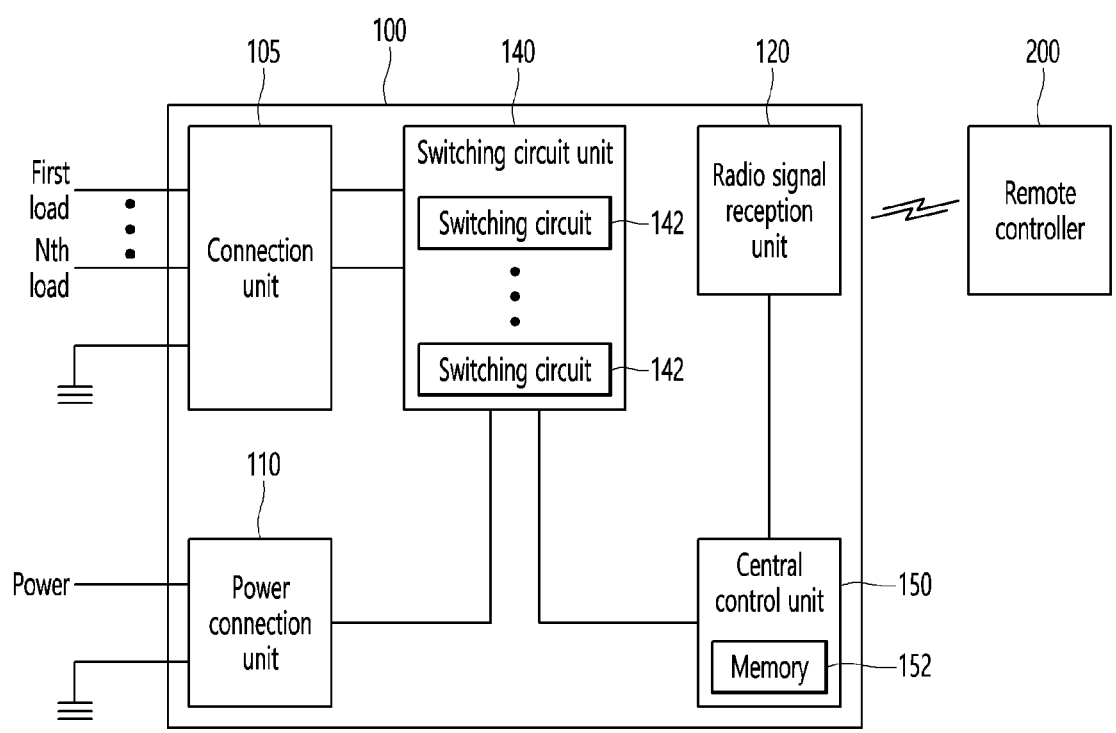
FIG. 1 is a diagram illustrating a system to which an electronic switch according to an embodiment of the present invention is applied.

Hereinafter, specific embodiments of the present invention will be described with reference to the accompanying drawings. The following detailed description is provided to contribute to a comprehensive understanding of a method, apparatus, and/or system described herein. However, these embodiments merely illustrative examples, and the present invention is not limited thereto.

In descriptions of the embodiments of the present invention, publicly known techniques that are judged to be able to make the purport of the present invention unnecessarily obscure will not be described in detail. Referring to the drawings, wherein like reference characters designate like or corresponding parts throughout the several views. The terms as used herein are defined by taking functions of the present disclosure into account and can be changed according to the custom or intention of users or operators. Therefore, definition of the terms should be made according to the overall disclosure set forth herein. In addition, the terminology used herein is for the purpose of describing particular embodiments only and is not intended to limit the present invention thereto. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an electronic switch and a method for operation thereof will be described with reference to the accompanying drawings.

Figure 2:
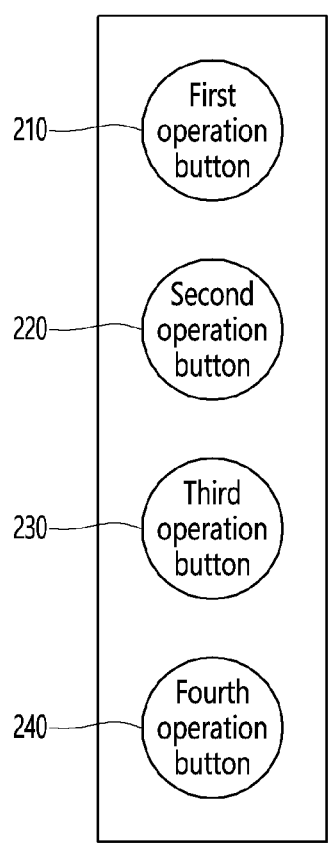
FIG. 2 is a diagram illustrating a configuration of a remote controller applied to the system according to the embodiment of the present invention.
Figure 3:
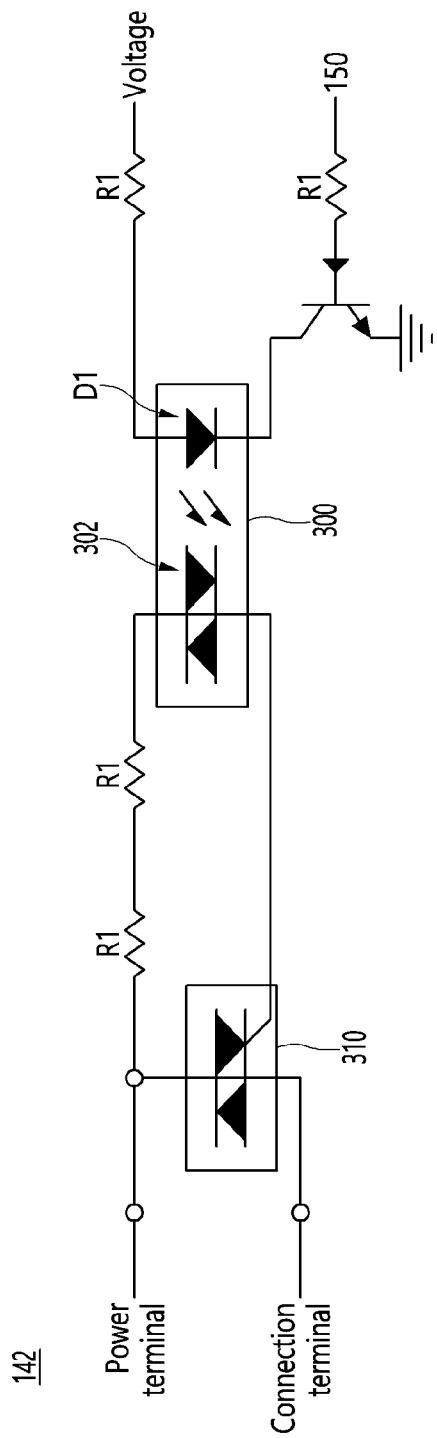
FIG. 3 is a circuit diagram illustrating a switching circuit applied to the electronic switch according to the embodiment of the present invention.

FIG. 1 is a diagram illustrating a system to which an electronic switch according to an embodiment of the present invention is applied, FIG. 2 is a diagram illustrating a configuration of a remote controller applied to the system according to the embodiment of the present invention, and FIG. 3 is a circuit diagram illustrating a switching circuit applied to the electronic switch according to the embodiment of the present invention.

As shown in FIGS. 1 and 2, an electronic switch 100 is wirelessly connected to a remote controller 200 to receive a radio signal transmitted according to an operation of buttons 210 to 240 provided in the remote controller 200, and may control the power applied to each load based on the received radio signal.

In an embodiment of the present invention, the remote controller 200 may send a radio signal in a frequency band of 322 MHz or less or a frequency band of 424 MHz to 447

MHz, and may send radio signals having different identifiers from each other for each of first to fourth operation buttons 210 to 240.

In addition, the remote controller 200 may include the first to fourth operation buttons 210 to 240 for controlling supply of power to loads connected to the electronic switch 100.

The first operation button 210 is configured to control the supply of power to a first load connected to the electronic switch 100, and when the first load is an electric light, the button may be provided to turn on or off the electric light.

The second operation button 220 is configured to control the supply of power to a second load connected to the electronic switch 100, and when the second load is an electric light, the button may be provided to turn on or off the electric light.

The third operation button 230 is configured to supply power to the first and second loads connected to the electronic switch 100, and when the first and second loads are electric lights, the button may be provided to turn on all of the electric lights.

The fourth operation button 240 is configured to cut off the supply of power to the first and second loads connected to the electronic switch 100, and when the first and second loads are electric lights, the button may be provided to turn off all of the electric lights.

Meanwhile, the electronic switch 100 according to an embodiment of the present invention that performs a switching operation in conjunction with the remote controller 200 as described above may include a connection unit 105 to which each load is connected, a power connection unit 110 connected with a power supply, a radio signal reception unit 120 configured to receive a radio signal sent from the remote controller 200, a switching circuit unit 140 including switching circuits 142 corresponding to each load, and a central control unit 150.

The connection unit 105 is composed of connection terminals to which each load operating according to the supply of power is connected, and may include a ground terminal.

In addition, each connection terminal of the connection unit 105 may be connected to each switching circuit 142 of the switching circuit unit 140. Accordingly, the number of switching circuits 142 may be determined according to the number of the respective connection terminals.

The power connection unit 110 may include power terminals for receiving a power from an outside and the ground terminal.

In addition, the power terminals of the power connection unit 110 may be connected with the switching circuits 142 of the switching circuit unit 140 in parallel to apply the power to each switching circuit 142, that is, a power to be supplied to each load.

The radio signal reception unit 120 may receive a radio signal from the remote controller 200 and may provide the received radio signal to the central control unit 150.

In an embodiment of the present invention, the radio signal reception unit 120 may receive a radio signal in a frequency band of 322 MHz or less, or a frequency band of 424 MHz to 447 MHz.

The switching circuit unit 140 is connected with the power terminals of the power connection unit 110 to receive the power, and may be connected to the connection terminals connected to each load of the connection unit 105 to supply the received power to each load according to the switching operation.

The switching circuit unit 140 according to the embodiment of the present invention may include the switching circuits 142 connected to each of the connection terminals.

When receiving a switching control signal for a turn-on operation from the central control unit 150, each switching circuit 142 may supply the power received via the power connection unit 110 to the loads through the connection terminals.

In addition, when receiving a switching control signal for a turn-off operation from the central control unit 150, each switching circuit 142 may cut off the power supplied to the loads.

Each switching circuit 142 may perform a turn-on or off operation by receiving different switching control signals.

In particular, as shown in FIG. 3, each switching circuit 142 of the switching circuit unit 140 according to the embodiment of the present invention may include a photo TRIAC coupler 300 to which the switching control signal is input, and a TRIAC 310 for opening and closing, which is connected with the photo TRIAC coupler 300 to connect and brake the connection between the power terminal and the connection terminal.

The photo TRIAC coupler 300 of the switching circuit 142 may include a photodiode D1 which receives a driving voltage from one end thereof, and is connected with a transistor T1 which is a switching element, and a TRIAC 302 for a photo coupler, which is turned on according to the light emission of the photodiode D1 during operation.

In addition, the switching circuit 142 may include resistors R1 in each of internal elements, which are a plurality of passive elements for driving.

First, a switching control signal generated from the central control unit 150 may be transmitted to the transistor T1, which is a switching element. That is, when receiving a switching control signal for a turn-on operation, the transistor T1 is turned on to ground the photodiode D1, so that the photodiode D1 may be a turn-on state, that is, a light emission state.

The TRIAC 302 for a photo coupler may be turned on according to the light emission of the photodiode D1 to turn on the TRIAC 310 for opening and closing, and thereby the connection terminal and the power terminal are connected with each other. Therefore, the power received via the power terminal is supplied to the load through the connection terminal.

When the TRIAC 302 for a photo coupler, the connection terminal and the power terminal are connected with each other, the TRIAC 310 for opening and closing may be turned on according to the turn-on state of the TRIAC 302 for a photo coupler to supply electric current to the connection terminal and the power terminal. Therefore, the power may be supplied to the load connected to the connection terminal.

Meanwhile, when the switching control signal for a turn-off operation is transmitted to the transistor T1, the state of the photodiode D1 may be changed to a turn-off state, that is, to a non-light emission state when the transistor T1 is turned off.

The TRIAC 302 for a photo coupler is turned off due to the non-light emission of the photodiode D1.

Accordingly, the TRIAC 310 for opening and closing may be turned off to break the connection between the connection terminal and the power terminal, and thereby the supply of power to the load connected to the connection terminal may be stopped.

When receiving a radio signal, the central control unit 150 extracts an identifier in the received radio signal, and generates a switching control signal to be transmitted to each of the switching circuits 142 by using the extracted identifier.

For example, when receiving a radio signal (radio signal including Identifier 1) from the remote controller 200 according to an operation of the first operation button 210, the central control unit 150 may generate a switching control signal for turning on the switching circuit 142 connected to the first load, and when receiving a radio signal (radio signal including Identifier 2) from the remote controller 200 according to an operation of the second operation button 220, the central control unit 150 may generate a switching control signal for turning on the switching circuit 142 connected to the second load.

In addition, when receiving a radio signal (radio signal including Identifier 3) from the remote controller 200 according to an operation of the third operation button 230, the central control unit 150 may generate a switching control signal for turning on each of the switching circuits 142 connected to the first and second loads, and when receiving a radio signal (radio signal including identifier 4) from the remote controller 200 according to an operation of the fourth operation button 240, the central control unit 150 may generate a switching control signal for turning off each of the switching circuits 142 connected to the first and second loads.

To this end, the central control unit 150 according to the embodiment of the present invention is connected with each switching circuit 142 using different terminals from each other, with which each of the identifiers is matched, and may transmit the switching control signal to the switching circuit 142 through the corresponding terminal according to the identifier.

In addition, the central control unit 150 according to the embodiment of the present invention may be configured to, when receiving a radio signal having an identifier, temporarily store the identifier in a memory 152, and when receiving a radio signal having the same identifier as the identifier stored in the memory 152, generate a switching control signal different from the previously generated switching control signal. That is, the central control unit 150 may be configured to, when initially receiving a radio signal having Identifier 1, generate a turn-on switching control signal for turning on the switching circuit 142 connected to the first load, and store Identifier 1 in the memory 152, and when receiving again the radio signal having Identifier 1 within a preset time, generate a turn-on switching control signal for turning on the switching circuit 142 connected to the first load, and then delete Identifier 1 stored in the memory 152.

Meanwhile, the central control unit 150 may be configured to, when receiving a radio signal for controlling the supply of power for each load, that is, a radio signal having Identifier 1 or 2, store Identifier 1 or 2 in the memory 152, and then if the radio signal is not received until a preset time elapses, delete the information stored in the memory 152.

In addition, when receiving a radio signal having Identifier 3 or 4, that is, a radio signal for supplying power to the entire load or cutting off the power after Identifier 1 or 2 is stored in the memory 152, the central control unit 150 may delete information thereof stored in the memory 152.

In other words, the central control unit 150 may be configured to, when receiving a radio signal having an identifier for controlling each load, store the same in the memory 152, and if another radio signal is not received until the preset time elapses, or receiving a radio signal for controlling supply of power to the entire load, delete the information stored in the memory 152.

An operation of the electronic switch 100 having the above-described configuration will be described with reference to FIG. 4.

Figure 4:
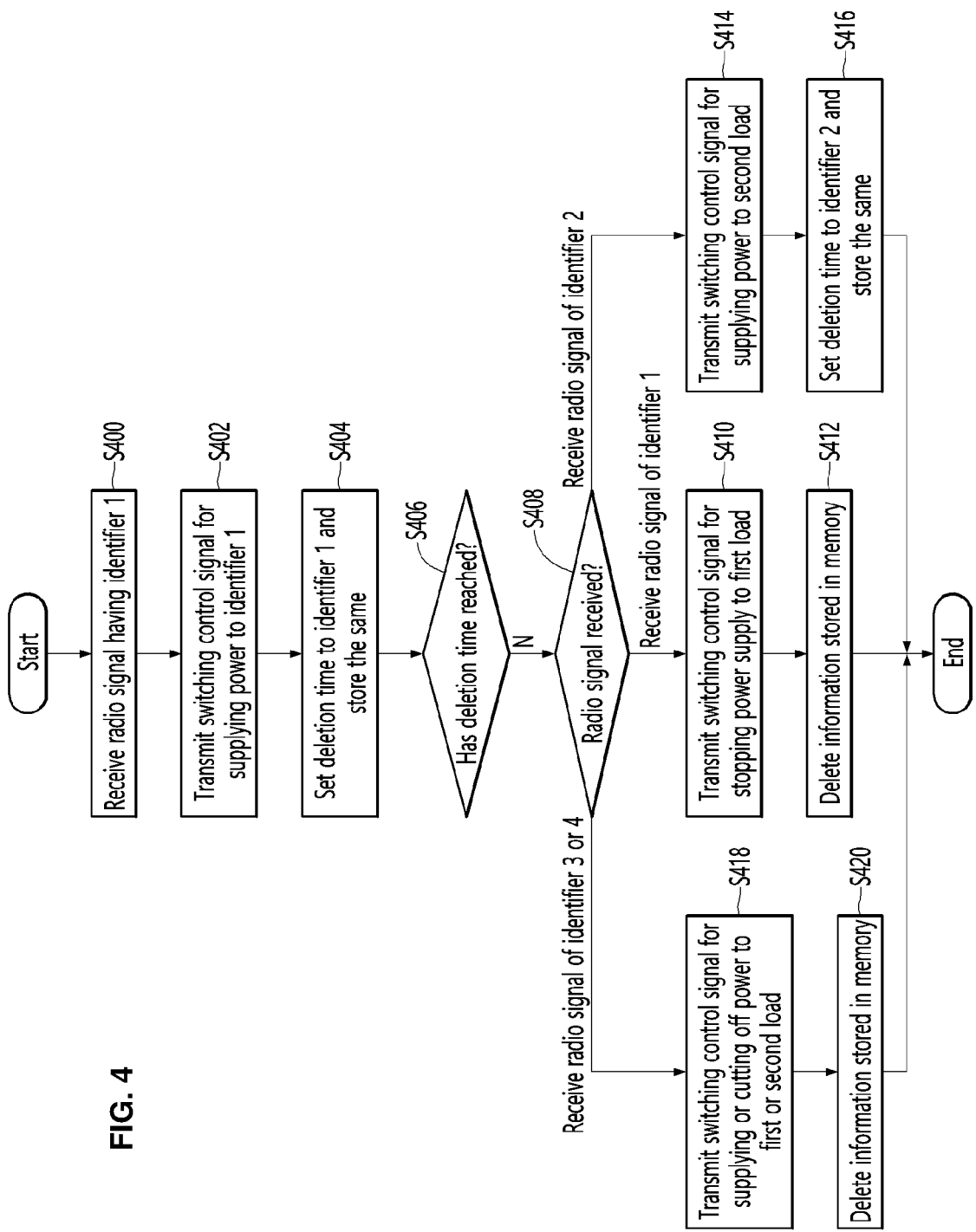
FIG. 4 is a flowchart illustrating a process of operating the electronic switch according to the embodiment of the present invention.

FIG. 4 is a flowchart illustrating a process of operating the electronic switch 100 according to the embodiment of the present invention.

Prior to the description with reference to FIG. 4, the operation of the electronic switch 100 may be performed by a program, for example, firmware installed in the central control unit 150.

As shown in FIG. 4, when receiving a radio signal having Identifier 1 (S400), the central control unit 150 generates a switching control signal for turning on the switching circuit 142 connected to the first load to supply power and transmits the signal to the switching circuit 142 (S402).

Thereafter, the central control unit 150 sets a deletion time to Identifier 1 and stores the same in the memory 152 (S404).

Then, the central control unit 150 determines whether the deletion time has been reached (S406).

As a result of the determination in S406, if it is determined that the deletion time has not been reached, the central control unit 150 determines whether a radio signal is received (S408).

As a result of the determination in S408, if it is determined that a radio signal having Identifier 1 is received, the central control unit 150 generates a switching control signal for turning off the switching circuit 142 connected to the first load to stop the supply of power and transmits the signal to the switching circuit 142 (S410), and then deletes the information stored in the memory 152 (S412).

As a result of the determination in S408, if it is determined that a radio signal having Identifier 2 is received, the central control unit 150 generates a switching control signal for turning on the switching circuit 142 connected to the second load to supply the power and transmits the signal to the switching circuit 142 (S414), and then sets a deletion time to identifier 2 and stores the same in the memory 152 (S416).

As a result of the determination in S408, if it is determined that a radio signal having Identifier 3 or 4 is received, the central control unit 150 generates a switching control signal for turning on or off each of the switching circuits 142 connected to the first and second loads and transmits the signal to the switching circuits 142 to supply or cut off the power (S418), and then deletes the information stored in the memory 152 (S420).

The above description is merely illustrative of the technical idea of the present invention, and those skilled art to which the present invention pertains will appreciate that various modifications and variations are possible without departing from the essential characteristics of the present invention. Therefore, the embodiments disclosed in the present invention are intended to describe the technical spirit of the present invention, and are not intended to limit the same, as well as the scope of the technical spirit of the present invention is not limited to these embodiments. It should be understood that the protective scope of the present invention is interpreted by the claims below, and all technical ideas within the equivalent range are included in the scope of the present invention.

DESCRIPTION OF REFERENCE NUMERALS

100: Electronic switch
105: Connection unit
110: Power connection unit
120: Radio signal reception unit
140: Switching circuit unit 150: Central control unit
200: Remote controller
300: Photo TRIAC coupler
310: TRIAC for opening and closing

What is claimed is:

1. An electronic switch comprising:
a connection unit including connection terminals to which at least two or more loads requiring supply of power are respectively connected;
a power connection unit including power terminals configured to receive external power;
a radio signal reception unit configured to receive a radio signal and is wirelessly connected to a remote controller which includes at least two or more operation buttons for controlling supply of power to each load connected to the connection unit, the remote controller sends radio signals having different identifiers according to an operation of each of the operation buttons;
a switching circuit unit which is configured to receive power from the power terminals of the power connection unit, includes switching circuits connected to each of the connection terminals, and is configured to supply the power to the loads connected to the connection terminals or cut off supply of power according to a turn-on or turn-off operation of the switching circuit based on a switching control signal; and
a central control unit configured to, when receiving the radio signal, generate a switching control signal to be transmitted to each of the switching circuits using an identifier in the received radio signal;
wherein the central control unit is configured to, when receiving the radio signal for controlling any one of the loads connected to the connection unit, generate a switching control signal for turning on a switching circuit connected to any one of the loads, and then match a deletion time with the identifier in the received radio signal and store the identifier in a memory, and when again receiving the radio signal having an identifier stored in the memory within a deletion time, generate a switching control signal for turning off the switching circuit connected to any one of the loads and delete the identifier stored in the memory.

2. The electronic switch according to claim 1, wherein the remote controller sends a radio signal having a frequency band of 322 MHz or less or a frequency band of 424 MHz to 447 MHz.

3. The electronic switch according to claim 1, wherein the central control unit is configured to, when receiving the radio signal for controlling all loads connected to the connection unit within the deletion time, supply a power to the loads or cut off the supply of power, and delete the identifier stored in the memory.

4. The electronic switch according to claim 1, wherein the connection unit includes first and second connection terminals, and when first and second loads are connected to the first and second connection terminals, the remote controller, which includes first and second operation buttons for controlling supply of power to the first and second loads and at least one or more buttons for controlling supply of power to both of the first load and the second load, sends radio signals having different identifiers from each other for each of the operation buttons,
the switching circuit unit includes first and second switching circuits connected to the first and second connection terminals, respectively, and
when receiving the radio signal, the central control unit generates a switching control signal for controlling one or both of the first and second switching circuits using the identifier in the received radio signal.

5. The electronic switch according to claim 1, wherein each of the switching circuits comprises:
a photo TRIAC coupler configured to be turned on or off by receiving the switching control signal; and
a TRIAC configured to, when the photo TRIAC coupler is turned on, connect the connection terminal and the power terminal so that the power is supplied to the load connected to the connection terminal, and when the photo TRIAC coupler is turned off, break the connection between the connection terminal and the power terminal so that supply of power to the load connected to the connection terminal is stopped.

6. A method for controlling an electronic switch comprising: a connection unit including connection terminals to which at least two or more loads requiring supply of power are respectively connected; a power connection unit including power terminals configured to receive external power; a radio signal reception unit configured to receive an external radio signal; and a switching circuit unit which is configured to receive power from the power terminals of the power connection unit, includes switching circuits connected to each of the connection terminals, and is configured to supply the power to the loads connected to the connection terminals or cut off supply of power according to a turn-on or turn-off operation of the switching circuit based on a switching control signal, the method comprising:
receiving, by the radio signal reception unit, a radio signal having an identifier for controlling one or more of the loads connected to the connection unit from a remote controller which includes two or more operation buttons for controlling supply of power to each load connected to the connection unit;
generating, by a central control unit, a switching control signal for turning on a switching circuit connected to any one of the loads;
matching, by the central control unit, a deletion time with the received identifier and storing the identifier in a memory; and
when receiving a subsequent radio signal having an identifier stored in the memory within a deletion time, generating, by the central control unit, a switching control signal for turning off a switching circuit connected to any one of the loads, and deleting the identifier stored in the memory.

7. The method according to claim 6, further comprising:
when receiving the radio signal having an identifier for controlling all of the loads connected to the connection unit within the deletion time, generating, by the central control unit, a switching control signal for turning on or off each of the switching circuits to supply a power to the loads or cut off the supply of power, and deleting the identifier stored in the memory.

8. The method of claim 6, wherein, in the step of receiving the radio signal, a radio signal having a frequency band of 322 MHz or less or a frequency band of 424 MHz to 447 MHz is received from the remote controller.

* * * * *